(12) United States Patent
Muchherla et al.

(10) Patent No.: US 11,823,722 B2
(45) Date of Patent: Nov. 21, 2023

(54) DETERMINING VOLTAGE OFFSETS FOR MEMORY READ OPERATIONS

(71) Applicant: MICRON TECHNOLOGY, INC., Boise, ID (US)

(72) Inventors: Kishore Kumar Muchherla, Fremont, CA (US); Mustafa N Kaynak, San Diego, CA (US); Sampath K Ratnam, Boise, ID (US); Shane Nowell, Boise, ID (US); Peter Feeley, Boise, ID (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 18/110,008

(22) Filed: Feb. 15, 2023

(65) Prior Publication Data

US 2023/0282293 A1 Sep. 7, 2023

Related U.S. Application Data

(63) Continuation of application No. 17/233,320, filed on Apr. 16, 2021, now Pat. No. 11,587,627.

(51) Int. Cl.
| | |
|---|---|
| *G11C 11/34* | (2006.01) |
| *G11C 16/34* | (2006.01) |
| *G11C 16/30* | (2006.01) |
| *G11C 16/10* | (2006.01) |
| *G11C 16/32* | (2006.01) |
| *G11C 16/26* | (2006.01) |

(52) U.S. Cl.
CPC ........ *G11C 16/3404* (2013.01); *G11C 16/102* (2013.01); *G11C 16/26* (2013.01); *G11C 16/30* (2013.01); *G11C 16/32* (2013.01)

(58) Field of Classification Search
CPC ... G11C 16/3404; G11C 16/102; G11C 16/26; G11C 16/30; G11C 16/32
USPC ...................................... 365/185.24
See application file for complete search history.

(56) References Cited

U.S. PATENT DOCUMENTS

| | | | |
|---|---|---|---|
| 8,879,324 | B2 | 11/2014 | Alhussien et al. |
| 9,431,121 | B2 | 8/2016 | Muchherla et al. |
| 9,576,671 | B2 | 2/2017 | Karakulak et al. |
| 9,720,954 | B2 | 8/2017 | Wilding |

(Continued)

OTHER PUBLICATIONS

International Search Report and Written Opinion for International Application No. PCT/US2022/025095, dated Jul. 8, 2022, 8 Pages.

(Continued)

*Primary Examiner* — Viet Q Nguyen
(74) *Attorney, Agent, or Firm* — Lowenstein Sandler LLP

(57) ABSTRACT

A processing device of a memory sub-system is configured to identify a read level of a plurality of read levels associated with a voltage bin of a plurality of voltage bins of a memory device; assign a first threshold voltage offset to the read level of the voltage bin; assign a second threshold voltage offset to the read level of the voltage bin; perform, on block associated with the read level, a first operation of a first operation type using the first threshold voltage offset; and perform, on the blocks associated with the read level, a second operation of a second operation type using the second threshold voltage offset.

20 Claims, 9 Drawing Sheets

(56) References Cited

U.S. PATENT DOCUMENTS

| | | | |
|---|---|---|---|
| 10,289,341 | B2 | 5/2019 | Kirshenbaum et al. |
| 10,566,061 | B2 | 2/2020 | Karakulak et al. |
| 10,726,934 | B2 | 7/2020 | Chew et al. |
| 10,936,392 | B2 | 3/2021 | Hoei et al. |
| 11,004,517 | B2 | 5/2021 | Lee et al. |
| 11,222,704 | B1 * | 1/2022 | Rayaprolu .......... G11C 16/3404 |
| 11,270,772 | B1 | 3/2022 | Rayaprolu et al. |
| 11,340,813 | B1 * | 5/2022 | Rayaprolu .............. G11C 16/26 |
| 11,355,209 | B2 | 6/2022 | Sarpatwari et al. |
| 11,372,545 | B2 * | 6/2022 | Nowell ................. G06F 3/0659 |
| 11,404,139 | B2 * | 8/2022 | Rayaprolu ............ G11C 29/028 |
| 11,410,734 | B1 * | 8/2022 | Muchherla ............. G11C 16/20 |
| 11,443,830 | B1 * | 9/2022 | Sheperek ............. G11C 16/349 |
| 11,587,639 | B2 * | 2/2023 | Muchherla ........... G11C 29/021 |
| 11,593,005 | B2 * | 2/2023 | Muchherla ............ G06F 3/0604 |
| 11,676,664 | B2 * | 6/2023 | Muchherla .......... G11C 11/5642 365/185.11 |
| 2014/0286102 | A1 | 9/2014 | Wu et al. |
| 2014/0293696 | A1 | 10/2014 | Lin et al. |
| 2014/0334228 | A1 | 11/2014 | Kim et al. |
| 2015/0339057 | A1 | 11/2015 | Choi et al. |
| 2017/0271031 | A1 | 9/2017 | Sharon et al. |
| 2018/0261296 | A1 | 9/2018 | Choi et al. |
| 2019/0102097 | A1 | 4/2019 | Madraswala et al. |
| 2021/0065813 | A1 | 3/2021 | Papandreou et al. |
| 2022/0059179 | A1 | 2/2022 | Sheperek et al. |
| 2022/0059181 | A1 | 2/2022 | Sheperek et al. |
| 2022/0076760 | A1 | 3/2022 | Kaynak et al. |
| 2022/0189595 | A1 | 6/2022 | Ben-Joseph et al. |

OTHER PUBLICATIONS

International Search Report and Written Opinion for International Application No. PCT/US2022/25095, dated Jul. 8, 2022, 10 Pages.
Notice of Allowance for U.S. Appl. No. 17/233,320, dated Oct. 21, 2022, 8 Pages.

* cited by examiner

FIG. 2

Offset table 230

| Bin | TLC1 | TLC2 | TLC3 | TLC4 | TLC5 | TLC6 | TLC7 | MLC1 | MLC2 | MLC3 | SLC |
|---|---|---|---|---|---|---|---|---|---|---|---|
| 1 | 0 | 1 | 1 | 1 | -2 | -3 | -4 | 0 | 2 | 2 | |
| 1 | | | | | | | | | | | |
| 2 | | | | | | | | | | | |
| ⋮ | | | | | | | | | | | |
| 64 | | | | | | | | | | | |

Block Table 220

| Index | Die 0 bin | Die 1 bin | ... | Die N bin |
|---|---|---|---|---|
| 1 | 5 | 6 | | 4 |
| 2 | 4 | 2 | | 5 |
| 3 | | | | |
| 4 | 3 | | | |
| 5 | | | | |
| ⋮ | | | | |
| 20 | | | | |
| 21 | | | | |
| 22 | | | | |
| ⋮ | | | | |
| 62 | | | | |
| 63 | | | | |
| 64 | | | | |

SuperBlock Table 210

| SuperBlock | Partition | Time Hr | Temp | Block |
|---|---|---|---|---|
| 0 | 0 | 10 | 31 | 4 |
| 0 | 1 | 11 | 35 | 5 |
| 0 | 2 | 11 | 50 | 20 |
| 0 | ⋮ | | | 1 |
| 1 | 31 | | | 20 |
| 1 | 0 | | | 21 |
| 1 | 1 | | | 0 |
| 1 | 2 | | | 0 |
| 1 | 3 | | | 0 |
| ⋮ | ⋮ | | | 0 |
| 1 | 30 | | | |
| 1 | 31 | | | |
| ⋮ | ⋮ | | | |
| 745 | 29 | | | 22 |
| 745 | 30 | | | 0 |
| 745 | 31 | | | 0 |

DETERMINING VOLTAGE OFFSETS FOR MEMORY READ OPERATIONS

CROSS REFERENCE TO RELATED APPLICATIONS

This application is a Continuation of, and claims priority to, U.S. patent application Ser. No. 17/233,320, filed on Apr. 16, 2021, the entire contents of which is incorporated herein by reference.

TECHNICAL FIELD

Embodiments of the disclosure are generally related to memory sub-systems, and more specifically, are related determining voltage offsets for memory read operations.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 2 schematically illustrates example metadata maintained by the memory sub-system controller for associating blocks with voltage bins, in accordance with embodiments of the present disclosure.

DETAILED DESCRIPTION

Figure 1:
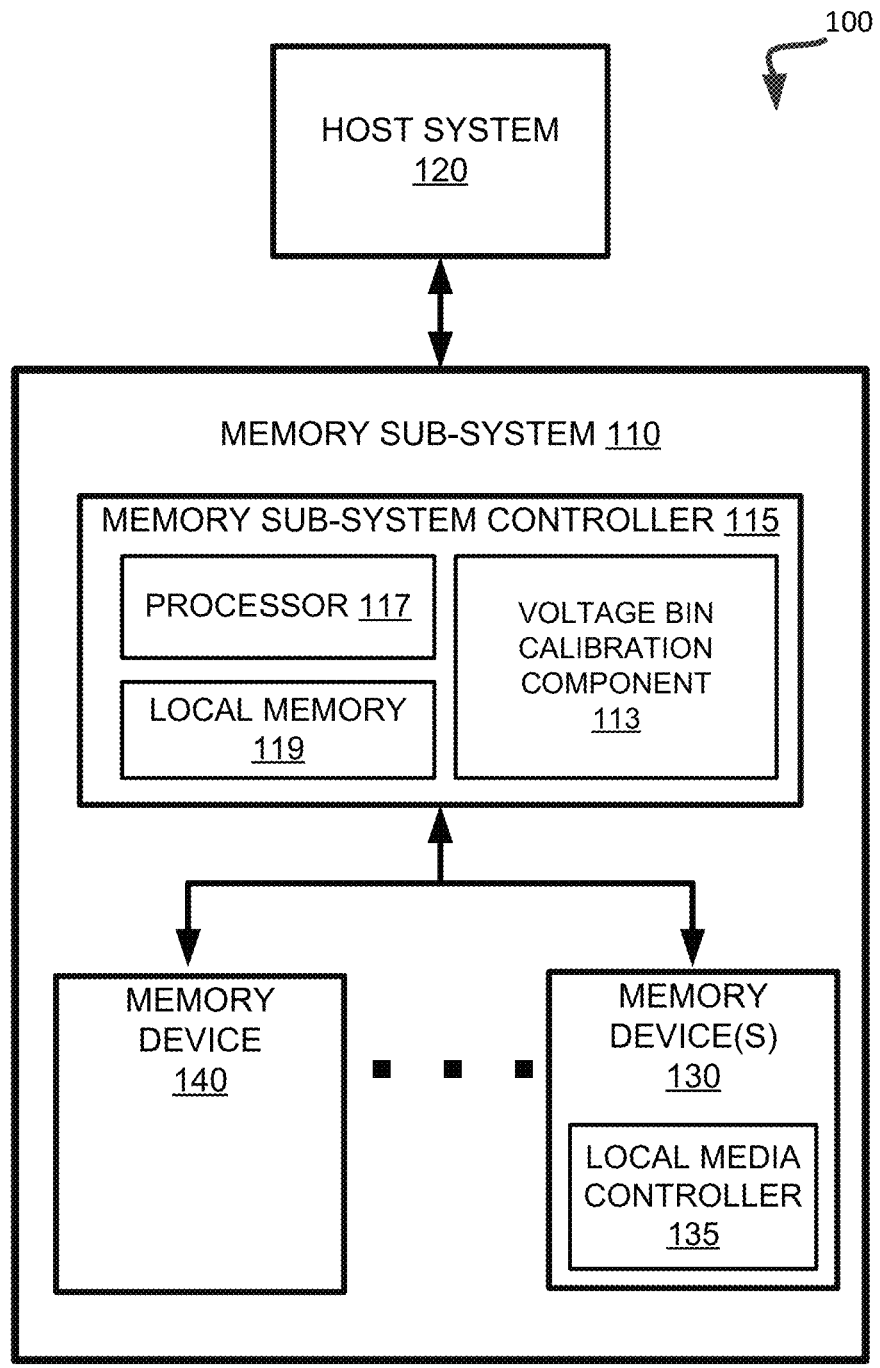
FIG. 1 illustrates an example computing system that includes a memory sub-system in accordance with some embodiments of the present disclosure.

Embodiments of the present disclosure are directed to threshold voltage determination for calibrating voltage bins of a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. A "block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC), parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows the establishment of multiple threshold voltage levels corresponding to different logical levels, thus effectively allowing a single memory cell to store multiple bits of information: a memory cell operated with 2n different threshold voltage levels is capable of storing n bits of information. Thus, the read operation can be performed by comparing the measured voltage exhibited by the memory cell to one or more reference read voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs a set of read threshold voltage bins ("voltage bins") and assigning each block stored at the memory devices of the memory sub-system voltage to one of the voltage bins, based on a time after program of each block, thus achieving a threshold voltage offset that results in efficient read operations for the block. An efficient read operation refers to a read with minimal need for error recovery, i.e., when first read attempt fails due to high error rate and the read operation goes through the error handling/error recovery steps to correct the errors. The error recovery process takes time and bandwidth and thus increases latency to return data to the host. Accordingly, an efficient read operation corresponds to a low bit error rate, which can be achieved by using the appropriate read threshold voltage that accounts for SCL. In summary, efficient read operation refers to low error rate and hence low latency. A voltage bin represents a set of read level threshold voltages that can be used to perform read operation at a given block, such that each read level threshold voltage corresponds to a voltage distribution valley, where each valley is a distance between two adjacent data states of the block to be read. For example, for TLC blocks storing 3 bits, there can be 8 data states (i.e., levels) corresponding to eight voltage distributions divided by seven valleys. Hence each voltage bin for TLC blocks has 7 offsets, i.e., one offset for each valley. In some implementations, reads can be associated with pages of a block. Each page type (TLC, SLC, etc.) corresponds to a certain number of valleys. For the page reads, appropriate offsets are read from the bin that is assigned to the block containing the page. The one or more valleys of each page type are determined by the code used to map data states (levels) to bits such as the Gray code. Gray code refers to a binary numeral system were two successive valleys differ in only one bit (e.g., binary digit). On TLC blocks, some parts of the block can be multi-level cell (MLC) storing 2 bits per memory cell (resulting in 4 data states), or single level cell (SLC) storing 1 bit per memory cell. For MLC and SLC parts, there can be 3 and 1 offset respectively. The associations of blocks with dies and with voltage bins can be stored in respective metadata tables maintained by the memory sub-system controller.

As explained above, the assignment of blocks of the memory device to voltage bins can reduce the impact of temporal voltage shift caused by the slow charge loss on the efficiency of the read operations of blocks of the memory device. However, slow charge loss, over time, can also impact the efficiency of the read operations for blocks within a single voltage bin. Accordingly, in order to maintain efficient read operations and minimizing bit error rate, a voltage bin calibration process can be performed to adjust threshold voltage offsets associated with each voltage bin. The calibration can involve, for each voltage offset bin, scanning the blocks associated with the voltage bin, e.g., at certain time intervals, determining an updated threshold voltage offset based on the read operations, and updating the threshold voltage offsets of the voltage bin based on the results of the read operations. Updating the threshold voltage offset for read operations, however, can cause an undesirable shift in boundaries between the voltage bins when the same threshold voltage offset is used for read operations and bin determination for programmed blocks of the memory device. Thus, embodiments of the present disclosure addresses this limitation by providing techniques to assign, to each voltage bin, a bin determination threshold voltage offset which is different from the read operation threshold voltage offset, thus minimizing the adverse impact of calibrating the threshold voltage offset for efficient read operations on the bin determination process for blocks of the memory device.

In accordance with embodiments of the present disclosure, a certain read level from a set of read levels of a voltage bin of a memory device can be identified for assignment of threshold voltage offsets. In an embodiment, two threshold voltage offsets can be assigned to each read level, such that read operations can be performed using the first threshold voltage offset and voltage bin determination operations can be performed using the second threshold voltage offset. Because the threshold voltage offset that is used for read operations can be frequently calibrated over time to maintain efficient read operations of host data, using a separate threshold voltage offset for bin determination when assigning programmed blocks to voltage bins can eliminate the potential shift in boundaries between voltage bins that can be caused by using the calibrated threshold voltage offset for bin determination. In one embodiment, the read operation threshold voltage offset and the bin determination threshold voltage offset can be assigned the same value when they are assigned to a given read level of the voltage bin. After assignment to the read level, and as time elapses, the read operation threshold voltage offset can be calibrated to maintain efficient read operations of blocks that are assigned to the voltage bin at the read level, whereas the bin determination threshold voltage offset can maintain its initial value without further calibration. In another embodiment, as time elapses after assignment to the read level, the read operation threshold voltage offset can be calibrated at a certain rate and the bin determination threshold voltage offset can be calibrated at another rate (e.g., a slower rate than the calibration rate of the read operation threshold voltage offset), thus enabling adjustments of the bin determination threshold voltage offset while continue to minimize the adverse impact of significantly changing voltage bin boundaries due to read voltage calibration.

In certain embodiments, the read operation threshold voltage offset and/or the bin determination threshold voltage offset of a given read level can initially be determined during a pre-characterization process that can be performed as a one-time process during manufacturing of the memory device. In other embodiments, the read operation threshold voltage offset and/or the bin determination threshold voltage offset of a given read level can initially be assigned the same value that can be determined based on a time after program (TAP) of blocks approaching a transition boundary between a voltage bin corresponding to the read level and a preceding voltage bin. In this case, a subset of the blocks of the preceding voltage bin that are approaching a transition boundary between the voltage bin and the preceding voltage bin, e.g., within a predetermined distance from the transition boundary, can be determined. In one embodiment, each of the voltage bins of the memory device can have a corresponding range of time after program (TAP) and a transition boundary between a voltage bin and a subsequent voltage bin corresponds to a specific TAP value, such that when a block assigned to the voltage bin reaches a TAP value that is greater than the specific TAP value corresponding to the transition boundary between the voltage bin and a subsequent voltage bin, the block is assigned to the subsequent voltage bin. In an implementation, blocks of a given voltage bin can approach a transition boundary between the voltage bin and a subsequent voltage bin due to slow charge loss of the memory cells of the blocks, as explained in more details above. When the subset of blocks approaching the transition boundary are identified, a threshold voltage offset that is efficient for read operations of the subset of blocks can be determined and then used as an initial value for the read operation threshold voltage offset and the bin determination threshold voltage offset of the subsequent voltage bin. In an implementation, SCL can depend on temperature as well. Accordingly TAP can also be time after program adjusted with a temperature of the block. As an example, SCL at 30 C is less than SCL at 90 C. Hence, TAP of 30 minutes at 90 C can result in an SCL value that is more than another SCL value after 30 minutes at 30 C. Consequently, an adjusted TAP can be computed by taking into account temperature, i.e., a normalized time with respect to a reference temperature such as 30 C. As an example, 30 minutes at 90 C might correspond a normalized time of 2 hours.

In one embodiment, an efficient threshold voltage offset of the subset of blocks can be determined by performing read operations of data stored at the subset of blocks and determining a threshold voltage offset that would result in a minimum bit error rate of the read operations. Since the subset of blocks approaching the transition boundary will be assigned to the subsequent voltage bin sooner than the other blocks that are assigned to the voltage bin, a threshold voltage offset that is efficient for read operations of the subset of blocks approaching the transition boundary is assigned as an initial value of the read operation threshold voltage offset and the bin determination threshold voltage offset of the subsequent voltage bin.

In an embodiment, the subset of blocks approaching the transition boundary for each read level of the set of read levels associated with the voltage bin can be determined, and the efficient threshold voltage offset of the subset of blocks can be utilized as the initial read operation threshold voltage offset and the bin determination threshold voltage offset of a corresponding read level of the voltage bin. The process of assigning the initial threshold voltage offsets can be repeated for each read level of the set of read levels of the subsequent voltage bin.

In some embodiments, when the read operation threshold voltage offset and the bin determination threshold voltage offset are assigned to read levels of voltage bins of the memory device, blocks storing host data can be assigned to a voltage bin at a corresponding read level, based on the bin determination threshold voltage offset of the read level of the voltage bin. In this case, a given block can be assigned to the voltage bin having a bin determination threshold voltage offset that, if applied as the read level offset, would result in the most reliable read operation of the block. As an example, a reliability metric (e.g., data state metric) based on the read operation of the given block can be determined. One example of a reliability metric is a raw bit error rate (RBER). The RBER can be defined as the ratio of the number of erroneous bits to the number of all data bits stored in a data unit of the memory sub-system. A set of read operations of the given block can be performed, using the bin determination threshold voltage offset of each of the voltage bins of the memory device, and the voltage bin that has a bin determination threshold voltage offset resulting in a minimum RBER of the read operation results can be selected. The block can then be assigned to the selected voltage bin. Further read operations of data stored at the block can be performed using the read operation threshold voltage offset of the voltage bin assigned to the block.

As time passes, the read operation threshold voltage offset of the voltage bin can be calibrated to maintain efficient read operations of blocks assigned to the voltage bin. In this case, the read operation threshold voltage offset can be updated based on results of read operations of at least some of the blocks assigned to the voltage bin. In some embodiments, as blocks get assigned to a given voltage bin over time, the value of the read operation threshold voltage offset of the given voltage bin can continue to be adjusted to enable efficient read operations of data of the blocks assigned to the voltage bin. The adjustment of the read operation threshold voltage offset can result in a shift of the adjusted threshold voltage offset towards a transition boundary between the voltage bin and a subsequent voltage bin, thus potentially skewing the read operation threshold voltage offset significantly from its initial value that corresponds to the boundary between the voltage bin and a preceding voltage bin. This shift in the read operation threshold voltage offset can result in inefficient read operations of blocks that are newly assigned to the voltage bin because the newly assigned blocks can have smaller TAP than a TAP corresponding to the shifted read operation threshold voltage offset, resulting in higher bit error rate of read operations performed using the read operation threshold voltage offset. In order to mitigate significant shift in the read operation threshold voltage offset of a voltage bin, the adjustment of read operation threshold voltage offset during voltage bin calibration can be limited, such that an adjusted read operation threshold voltage offset may not exceed a predetermined voltage threshold. In this case, if an adjusted read operation threshold voltage offset based on voltage bin calibration exceeds the predetermined voltage threshold of the voltage bin, the value of the adjusted read operation threshold voltage offset of the voltage bin can be reset to the predetermined voltage threshold of the voltage bin.

In one embodiment, as time passes, the bin determination threshold voltage offset of the voltage bin can also be calibrated to maintain efficient bin determination based on slow charge loss of blocks of the memory device. In other embodiments, the bin determination threshold voltage offset of the voltage bin can maintain its initial value without adjustment, while the read operation threshold voltage offset of the voltage bin can continue to be calibrated.

Therefore, advantages of the systems and methods implemented in accordance with some embodiments of the present disclosure include, but are not limited to, optimizing the performance of voltage bin calibration process, such that separate threshold voltage offsets for each voltage bin can be used for performing read operations and bin determination operations. Since read operations are performed using a dedicated threshold voltage offset of the voltage bin, calibrating the read operation threshold voltage offset would not impact other operations that are performed using the threshold voltage offset, e.g., bin determination operations. Additionally, since a memory sub system can determine an initial threshold voltage offset of a voltage bin based on scanning a set of blocks that are close to transitioning to the voltage bin, limiting the scanning operation to only the set of blocks approaching the transition boundary significantly reduces the performance penalty of the scan process during voltage bin calibration.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a voltage bin calibration component 113, which can be used to implement techniques for supporting voltage offsets for read operations separate from voltage offsets for bin determination for blocks of a memory device 130-140, in accordance with embodiments of the present disclosure. In one implementation, voltage bin calibration component 113 identifies a read level from a set of read levels of a voltage bin of memory device 130-140. In an implementation, two threshold voltage offsets can be assigned to each read level of each voltage bin; a read operation threshold voltage offset and a bin determination threshold voltage offset. Read operations of blocks assigned to the voltage bin can be performed using the read operation threshold voltage offset and voltage bin determination operations of the voltage bin can be performed using the bin determination threshold voltage offset. In one embodiment, voltage bin calibration component 113 can assign the same voltage offset value to both the read operation threshold voltage offset and the bin determination threshold voltage offset of the read level of the voltage bin. After assignment to the read level, and as time elapses, voltage bin calibration component 113 can calibrate the read operation threshold voltage offset to maintain efficient read operations of blocks that are assigned to the voltage bin at the read level, while maintaining the bin determination threshold voltage offset at its initial value without further calibration. In another embodiment, as time elapses after assignment to the read level, voltage bin calibration component 113 can calibrate the read operation threshold voltage offset at a certain rate and/or to a certain threshold and calibrate the bin determination threshold voltage at a different rate (e.g., a slower rate than the calibration rate of the read operation threshold voltage offset) and/or up to a lower threshold.

In certain embodiments, voltage bin calibration component 113 can initially determine the read operation threshold voltage offset and/or the bin determination threshold voltage offset of a read level during a pre-characterization process that can be performed as a one-time process during manufacturing of memory device 130-140. In other embodiments, voltage bin calibration component 113 can initially assign the same value to the read operation threshold voltage offset and the bin determination threshold voltage offset of a read level that can be determined based on a time after program (TAP) of blocks approaching a transition boundary between a voltage bin corresponding to the read level and a preceding voltage bin. In this case, voltage bin calibration component 113 identifies a subset of the blocks of the preceding voltage bin that are approaching a transition boundary between the voltage bin and the preceding voltage bin, e.g., within a predetermined distance from the transition boundary. When voltage bin calibration component 113 determines the subset of blocks approaching the transition boundary, voltage bin calibration component 113 can determine a threshold voltage offset that is efficient for read operations of the subset of blocks and then use the determined threshold voltage as an initial value for the read operation threshold voltage offset and the bin determination threshold voltage offset of the subsequent voltage bin.

In one implementation, voltage bin calibration component 113 can determine an efficient threshold voltage offset of the subset of blocks by performing read operations of data stored at the subset of blocks and determine a threshold voltage offset that result in a minimum bit error rate of the read operations. Voltage bin calibration component 113 can then assign the determined threshold voltage as an initial value of the read operation threshold voltage offset and the bin determination threshold voltage offset of the subsequent voltage bin. In an implementation, voltage bin calibration component 113 can determine the subset of blocks approaching the transition boundary for each read level of the set of read levels associated with the voltage bin, and the efficient threshold voltage offset of the subset of blocks can be assigned as the initial read operation threshold voltage offset and bin determination threshold voltage offset of a corresponding read level of the voltage bin. The process of assigning the initial threshold voltage offsets can be repeated for each read level of the set of read levels of the subsequent voltage bin.

In some implementations, when the read operation threshold voltage offset and the bin determination threshold voltage offset are assigned to read levels of voltage bins of memory device 130-140, voltage bin calibration component 113 can assign blocks storing host data at a certain read level to a voltage bin at a corresponding read level, based on the bin determination threshold voltage offset of the read level of the voltage bin. In this case, voltage bin calibration component 113 can assign a given block to the voltage bin having a bin determination threshold voltage offset that corresponds to the most reliable read operation of the block, based on a minimum RBER of the read operation for example. In this case, voltage bin calibration component 113 performs a set of read operations of the given block, using the bin determination threshold voltage offset of each of the voltage bins of memory device 130-140, and selects the voltage bin that has a bin determination threshold voltage offset resulting in a minimum RBER of the read operation results. Voltage bin calibration component 113 then assigns the block to the selected voltage bin. Voltage bin calibration component 113 can perform further read operations of data stored at the block using the read operation threshold voltage offset of the voltage bin assigned to the block.

As time passes, and due to slow charge loss for example, voltage bin calibration component 113 can calibrate the read operation threshold voltage offset of the voltage bin to maintain efficient read operations of blocks assigned to the voltage bin. In this case, voltage bin calibration component 113 updates the read operation threshold voltage offset based on results of read operations of at least some of the blocks assigned to the voltage bin. In some implementations, as blocks get assigned to a given voltage bin over time, voltage bin calibration component 113 continues to update the value of the read operation threshold voltage offset of the given voltage bin to enable efficient read operations of data of the blocks assigned to the voltage bin. In an implementation, in order to mitigate a significant shift in the read operation threshold voltage offset of a voltage bin that can result in inefficient read operation of blocks newly assigned to the voltage bin, voltage bin calibration component 113 can limit the adjustment of read operation threshold voltage offset during voltage bin calibration, such that an adjusted read operation threshold voltage offset may not exceed a predetermined voltage threshold. In this case, if an adjusted read operation threshold voltage offset based on voltage bin calibration exceeds the predetermined voltage threshold of the voltage bin, voltage bin calibration component 113 can reset the value of the adjusted read operation threshold voltage offset of the voltage bin to the predetermined voltage threshold of the voltage bin.

In certain implementations, as time passes, voltage bin calibration component 113 can also calibrate the bin determination threshold voltage offset of the voltage bin to maintain efficient bin determination operations based on slow charge loss of blocks of memory device 130-140. In other implementations, voltage bin calibration component 113 can maintain the bin determination threshold voltage offset of the voltage bin at its initial value without adjustment, while calibrating the read operation threshold voltage offset of the voltage bin.

FIG. 2 schematically illustrates example metadata maintained by the memory sub-system controller for associating blocks and/or partitions with voltage bins, in accordance with embodiments of the present disclosure. As schematically illustrated by FIG. 2, the memory sub-system controller can maintain the superblock table 210, the block table 220, and the offset table 230. Each record of the superblock table 210 specifies the block associated with the specified superblock and partition combination. In some implementations, the superblock table records can further include time and temperature values associated with the specified superblock and partition combination.

The block table 220 is indexed by the block number, such that each record of the block table 220 specifies, for the block referenced by the index of the record, a set of voltage bins associated with respective dies of the block. In other words, each record of the block table 220 includes a vector, each element of which specifies the voltage bin associated with the die referenced by the index of the vector element.

Finally, the offset table 230 is indexed by the bin number. A record of the offset table 230 specifies a set of read operation threshold voltage offsets (e.g., for TLC, MLC, and/or SLC) associated with a voltage bin. Another record specifies a set of bin determination threshold voltage offsets (e.g., for TLC, MLC, and/or SLC) associated with the voltage bin. The metadata tables 210-230 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 210 is used to identify the block identifier corresponding to the physical block number; then, the block identifier is used as the index to the block table 220 in order to determine the voltage bin associated with the block and the die; finally, the identified voltage bin is used as the index to the offset table 230 in order to determine the read operation threshold voltage offset and the bin determination threshold voltage offset corresponding to the bin. The memory sub-system controller can then additively apply the identified read operation threshold voltage offset to the base voltage read level in order to perform the requested read operation.

In the illustrative example of FIG. 2, the superblock table 210 maps partition 0 of the superblock 0 to block 4, which is utilized as the index to the block table 220 in order to determine that die 0 is mapped to voltage bin 3. The latter value is used as the index to the offset table in order to determine the threshold voltage offset values for voltage bin 3.

Figure 3:
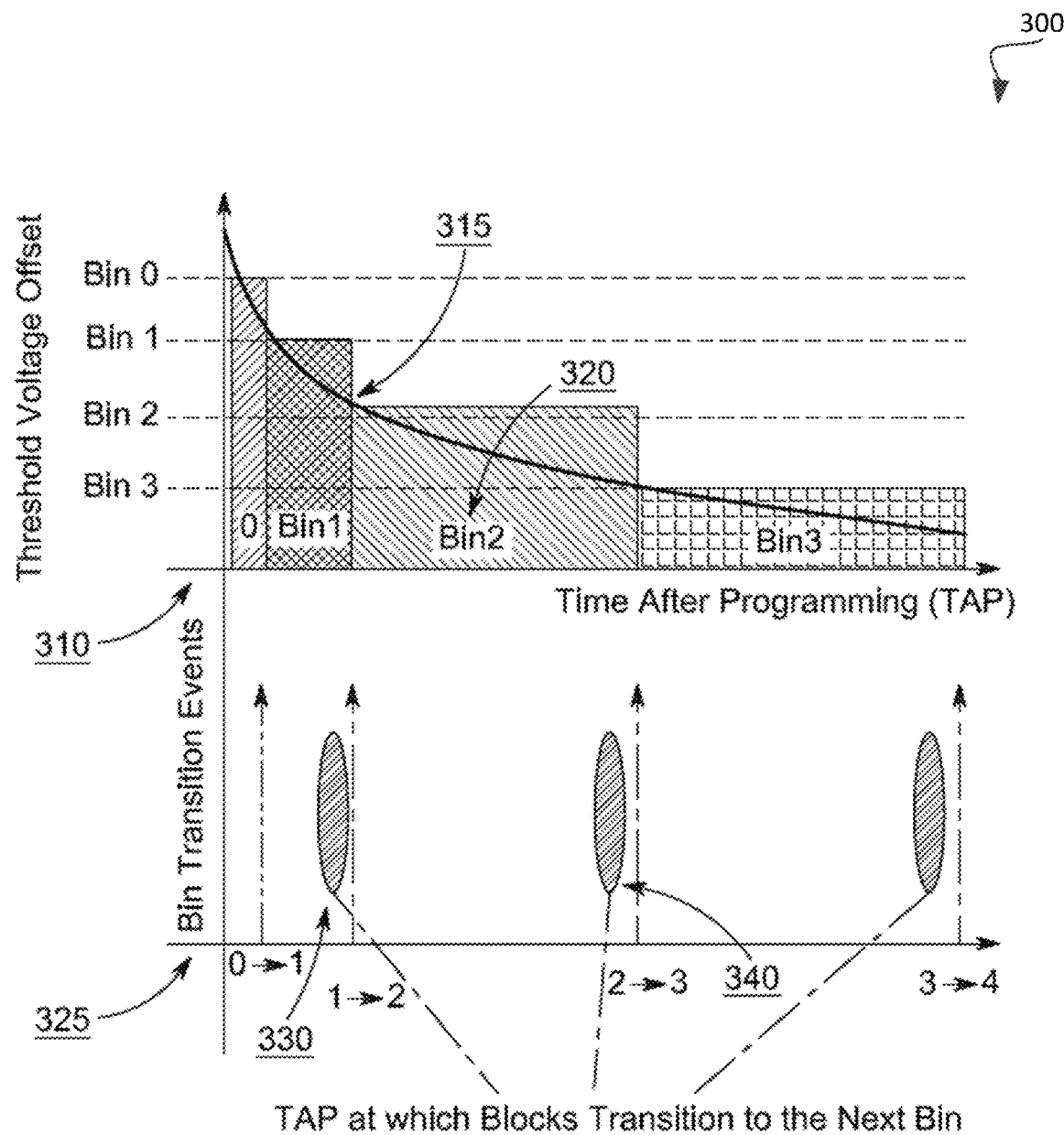
FIG. 3 illustrates an example method of calibrating voltage bins of a memory device based on threshold voltage offset of blocks approaching a transition boundary between voltage bins, in accordance with one or more aspects of the present disclosure.

FIG. 3 illustrates an example method of calibrating voltage bins of a memory device based on threshold voltage offset of blocks approaching a transition boundary between voltage bins, in accordance with one or more aspects of the present disclosure. Method 300 may be performed by processing logic that includes hardware (e.g., circuitry, dedicated logic, programmable logic, microcode, etc.), software (e.g., instructions run on a processor to perform hardware simulation), or a combination thereof. In some embodiments, the method 300 is performed by voltage bin calibration component 113 of FIG. 1. In one implementation, graph 310 schematically illustrates a set of voltage bins (bin 0 to bin 3), in accordance with embodiments of the present disclosure for a selected read level. Threshold voltage offset curve 315 illustrates the dependency of the threshold voltage offset, on the y-axis, on the time after program (which can be time normalized with respect to a particular temperature), the period of time elapsed since the block had been programmed, on the x-axis for the selected read level. In one implementation, blocks of the memory device that have been programmed within a specified time window are assigned to a voltage bin that corresponds to the time after program of the blocks. As noted herein above, given that wear-leveling can keep program/erase cycles similar on all blocks, the time elapsed after programming and temperature of the memory device are the main factors affecting the temporal voltage shift. Using normalized time takes into account the temperature profile and hence temperature information is incorporated. Accordingly, all blocks programmed within a specific time window (i.e., normalized time window) are presumed to exhibit similar distributions of threshold voltages in memory cells, and thus can be assigned to the same voltage bin and can utilize the same voltage offsets for read operations.

In one implementation, a newly programmed block can be associated with bin 0. Then, the memory sub-system controller can periodically perform a foreground or background calibration process in order to associate each die of every block with one of the predefined threshold voltage bins (bins 0-3 in the illustrative example of FIG. 3), which is in turn associated with the voltage offsets to be applied for read operations. The associations of blocks with voltage bins and dies can be stored in respective metadata tables maintained by the memory sub-system controller, as explained in more details herein with respect to FIG. 2. The threshold voltage offset of FIG. 3 are associated with a single valley. The threshold voltage offset value become more negative going down the y-axis, which corresponds to higher SCL. For each voltage bin, a separate threshold voltage offset can be assigned to each valley.

As schematically illustrated by FIG. 3, graph 310 can be subdivided into multiple voltage bins 320, such that each voltage bin corresponds to a predetermined range of threshold voltage offsets based on a corresponding range of TAP of the voltage bin. While the illustrative example of FIG. 3 defines four voltage bins, in other implementations, various other numbers of voltage bins can be employed (e.g., 10 bins). Based on a periodically performed calibration process, the memory sub-system controller associates each die of every block with a voltage bin, which defines a set of threshold voltage offsets to be applied to the base voltage read level in order to perform read operations of data of the block, as described in more detail herein below.

Graph 325 of FIG. 3 illustrates the process of calibrating voltage bins by assigning a threshold voltage offset to a voltage bin based on a threshold voltage offset of blocks approaching a transition boundary between voltage bins. In an implementation, a processing logic executing method 300 can determine a time after program (TAP) 330 corresponding to a transition boundary between bin 1 and bin 2. In an implementation, TAP 330 can be a specific value of time elapsed since programming a block. In other implementations, TAP 330 can be a range of values, such that a block having a TAP value that is within the TAP 330 range can be transitioned from voltage bin 1 to voltage bin 2.

In certain implementations, the processing logic can determine a set of blocks assigned to voltage bin 1 that are approaching boundary TAP 330 between voltage bin 1 and voltage bin 2. As an example, the processing logic can determine the set of blocks having a TAP value that is within a predetermined distance from TAP 330. When the set of blocks approaching the transition boundary corresponding to TAP 330 are determined, the processing logic can determine a threshold voltage offset that is efficient for read operations of the determined set of blocks, to be used as an initial threshold voltage offset for the selected read level of voltage bin 2. In an implementation, a set of efficient threshold voltage offsets (one for each valley) of the set of blocks can be determined by performing read operations of data stored at the set of blocks and determining a set of threshold voltage offsets that result in a minimum bit error rate of the read operations. When the set of threshold voltage offsets of the set of blocks is determined, the processing logic can assign the determined threshold voltage offset set as an initial value of the threshold voltage offsets of the selected read level of voltage bin 2. In an implementation, the processing logic can then assign blocks to voltage bin 2 and can utilize the initial value of the threshold voltage offsets to perform read operations of the newly assigned blocks that are associated with the selected read level. For each voltage bin, the set of read offsets includes one offset per valley, such as 7 offsets for TLC wordlines, for example. Page reads correspond to different valleys and as such can use corresponding read offsets. Read operations used to determine the set of read offsets can use different page types to cover all valleys.

Similarly, the processing logic can determine a TAP 340 corresponding to a transition boundary between voltage bin 2 and voltage bin 3. In an implementation, TAP 340 can be a specific value of time elapsed since programming a block. In other implementations, TAP 340 can be a range of values, such that a block having a TAP value that is within the TAP 340 range can be transitioned from voltage bin 2 to voltage bin 3. In certain implementations, the processing logic can determine a set of blocks assigned to voltage bin 2 that are approaching boundary TAP 340 between voltage bin 2 and voltage bin 3. As an example, the processing logic can determine the set of blocks having a TAP value that is within a predetermined distance from TAP 340. When the set of blocks approaching the transition boundary corresponding to TAP 340 are determined, the processing logic can determine a set of threshold voltage offsets that are efficient for read operations of the determined set of blocks, to be used as an initial set of threshold voltage offsets for the selected read level of voltage bin 3. When the se of threshold voltage offsets of the set of blocks is determined, the processing logic can assign the determined threshold voltage offset set as an initial value of the threshold voltage offset of the selected read level of voltage bin 3. In an implementation, the processing logic can then assign blocks to voltage bin 3 and can utilize the initial values of the threshold voltage offset to perform read operations of the newly assigned blocks that are associated with the selected read level.

Figure 4:
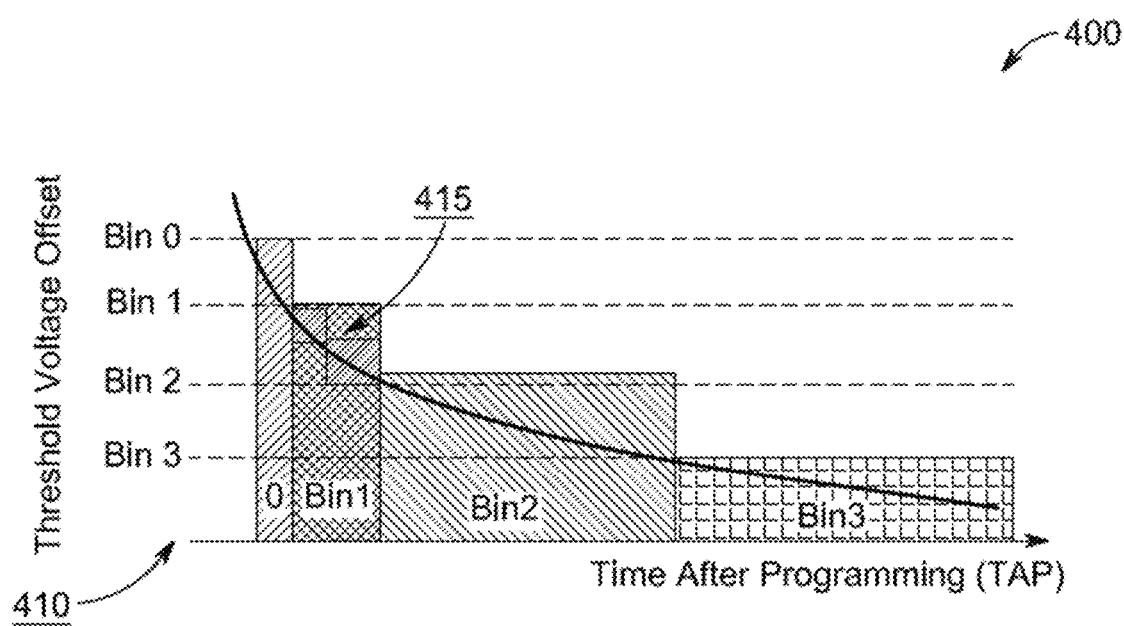
FIG. 4 illustrates an example method of calibrating a voltage bin of a memory device by adjusting a threshold voltage offset of the voltage bin to be within a range of threshold voltage offsets, in accordance with one or more aspects of the present disclosure.

FIG. 4 illustrates an example method 400 of calibrating a voltage bin of a memory device by adjusting threshold voltage offsets of the voltage bin to be within a range of threshold voltage offsets, in accordance with one or more aspects of the present disclosure. Method 400 may be performed by processing logic that includes hardware (e.g., circuitry, dedicated logic, programmable logic, microcode, etc.), software (e.g., instructions run on a processor to perform hardware simulation), or a combination thereof. In some embodiments, method 400 is performed by voltage bin calibration component 113 of FIG. 1. In one implementation, graph 410 schematically illustrates a set of voltage bins (bin 0 to bin 3), in accordance with embodiments of the present disclosure for a selected read level. In one implementation, blocks of the memory device that have been programmed within a specified time window are assigned to a voltage bin 0-3 that corresponds to the time after program of the blocks.

As schematically illustrated by FIG. 4, graph 410 can be subdivided into multiple voltage bins Bin 0-3, such that each voltage bin corresponds to a predetermined range of threshold voltage offsets based on a corresponding range of TAP of the voltage bin for each valley. While the illustrative example of FIG. 4 defines four voltage bins, in other implementations, various other numbers of voltage bins can be employed (e.g., 10 bins). In certain implementations, initial threshold voltage offset values can be assigned to a selected read level of each voltage bin 0-3 and blocks of the memory device can be assigned to one of voltage bins Bin 0-3 based on an efficient threshold voltage offset of the block and/or a TAP of the block.

In certain implementations, the processing logic can perform voltage bin calibration to adjust threshold voltage offsets of voltage bins, for example to accommodate die to die variations of the memory device. On the other hand, due to the non-linearity of threshold voltage offset versus TAP, as seen on graph 410 corresponding to a single valley, an efficient threshold voltage offset is not a linear function of TAP within a voltage bin as well. Accordingly, as bin voltage calibration is performed, based on blocks currently assigned to the voltage bin, there is a tendency that more statistical block samples for the calibration process are selected from larger TAP within a voltage bin, thus causing a calibrated threshold voltage offset to shift towards the higher TAP within a voltage bin. Shifting the threshold voltage offset can result in less efficient read operations of blocks newly assigned to the voltage bin. To mitigate significant shifts in a threshold voltage offset of a voltage bin 0-3 due to calibration, the processing logic can limit the adjustment of a threshold voltage offset during calibration, such that an adjusted threshold voltage offset may not exceed predetermined voltage threshold 415. In this case, if a calibrated threshold voltage offset of Bin 2 exceeds threshold voltage 415, the processing logic can set the value of the calibrated threshold voltage offset of Bin 1 to the predetermined voltage threshold 415. In an implementation, voltage threshold 415 can be approximately halfway within the range of threshold voltage offset of Bin 1, thus providing an improved read efficiency for newly assigned blocks as well as older blocks of Bin 1.

Figure 5:
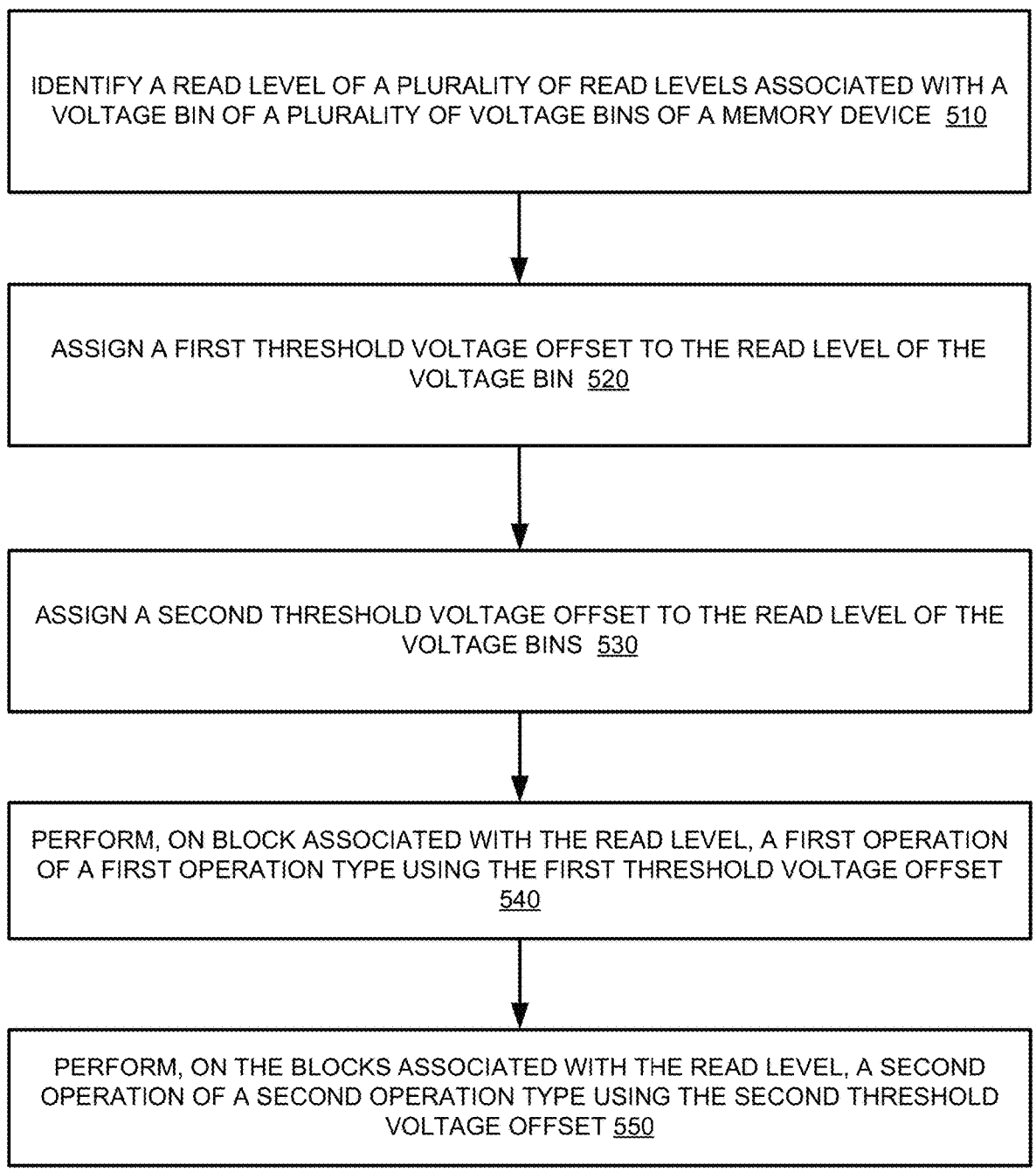
FIG. 5 is a flow diagram of an example method of supporting voltage offsets for read operations separate from voltage offsets for bin determination for blocks of a memory device, in accordance with some embodiments of the present disclosure.

FIG. 5 is a flow diagram of an example method of supporting voltage offsets for read operations separate from voltage offsets for bin determination for blocks of a memory device, in accordance with some embodiments of the present disclosure. The method 500 can be performed by a processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the voltage bin calibration component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 510, the processing logic identifies a read level of a set of read levels of a voltage bin of a set of voltage bins of a memory device. In one implementation, the set read levels corresponds to data states between valleys of memory cells, and the number of read levels is determined based on the type of the memory device, as explained in more details herein above.

At operation 520, the processing logic assigns a first threshold voltage offset to the read level of the voltage bin. In one implementation, the first threshold voltage offset can be a read operation threshold voltage offset that can be used for performing read operations of data stored at blocks assigned to the voltage bin at the corresponding read level, as explained in more details herein above.

At operation 530, the processing logic assigns a second threshold voltage offset to the read level of the voltage bin. In an implementation, the second threshold voltage offset can be a bin determination threshold voltage offset that can be used for determining a voltage bin to be assigned to blocks of the memory device at the corresponding read level, as explained in more details herein above.

At operation 540, the processing logic performs a read operation of data stored at block associated with the read level. The read operation is performed using the read operation threshold voltage offset of the voltage bin assigned to the block. In one implementation, the voltage bin includes a set of read operation threshold voltage offsets, each offset corresponds to a certain read level, and the processing logic selects the read operation threshold voltage offset associated with the read level matching the read level of the block, in performing the read operation of the block.

At operation 550, the processing logic performs a bin determination operation of block associated with a certain read level. The bin determination operation provides a block to be assigned to a voltage bin of the voltage bins of the memory device. The processing logic uses the bin determination threshold voltage offset of each voltage bin to perform a read operation of the block and then determines the voltage bin that corresponds the read operation with the minimum bit error rate, as explained in more details herein above. The determined voltage bin can then be assigned to the block.

Figure 6:
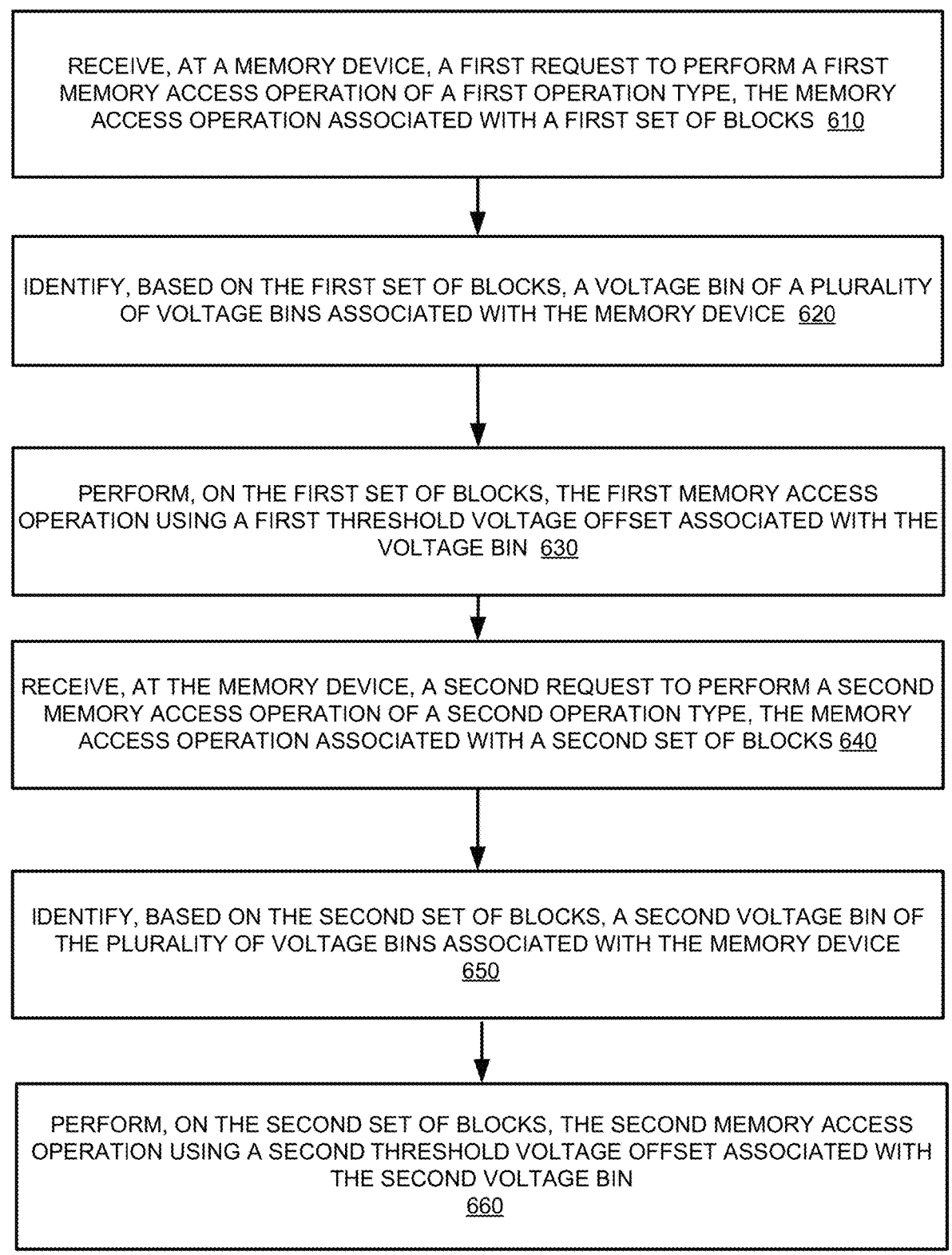
FIG. 6 is a flow diagram of an example method of performing read operations using a read operation threshold voltage offset of a voltage bin and performing bin determination operations using a bin determination threshold voltage offset of the voltage bin, in accordance with one or more aspects of the present disclosure.

FIG. 6 is a flow diagram of an example method of performing read operations using a read operation threshold voltage offset of a voltage bin and performing bin determination operations using a bin determination threshold voltage offset of the voltage bin, in accordance with one or more aspects of the present disclosure. The method 600 can be performed by a processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the voltage bin calibration component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 610, the processing logic receives, at a memory device, a request to perform a memory access operation of a certain operation type, where the memory access operation is associated with a set of blocks on which to perform the memory access operation. In an implementation, the memory access operation can be a read operation of the set of blocks provided with the read operation request.

At operation 620, the processing logic identifies a voltage bin corresponding to the set of blocks. In one implementation, the processing logic can access metadata tables to identify the voltage bin assigned to the set of blocks on which to perform the read operation. As an example, the set of blocks on which a single read operation can be performed can be assigned to a single voltage bin.

At operation 630, the processing logic performs the read operation of data stored at the set of blocks using a read operation threshold voltage offset associated with the voltage bin. In one implementation, the read operation threshold voltage offset can be calibrated to maintain an efficient read operation of the set of blocks assigned to the voltage bin, as explained in more details herein above.

At operation 640, the processing logic receives, at the memory device, a second request to perform a second memory access operation of another operation type, where the second memory access operation is associated with another set of blocks on which to perform the second memory access operation. In an implementation, the second memory access operation can be a bin determination operation to assign each block of the set of blocks to a voltage bin of the set of voltage bins of the memory device.

At operation 650, the processing logic identifies, based on the second set of blocks, a voltage bin of the set of voltage bins of the memory device. In an implementation, the second set of blocks can be already assigned to a voltage bin and the bin determination operation is utilized to reassign the second set of blocks to another voltage bin.

At operation 660, the processing logic performs a bin determination operation to determine a voltage bin to be assigned to the second set of blocks. In an implementation, the processing logic can perform a set of read operations of data stored at the second set of blocks, such that each read operation uses the bin determination threshold voltage offset from one of the voltage bins. The processing logic then determines the voltage bin resulting in a read operation with a minimum bit error rate, and assigns the second set of blocks to the determined voltage bin, as explained in more details herein above.

Figure 7:
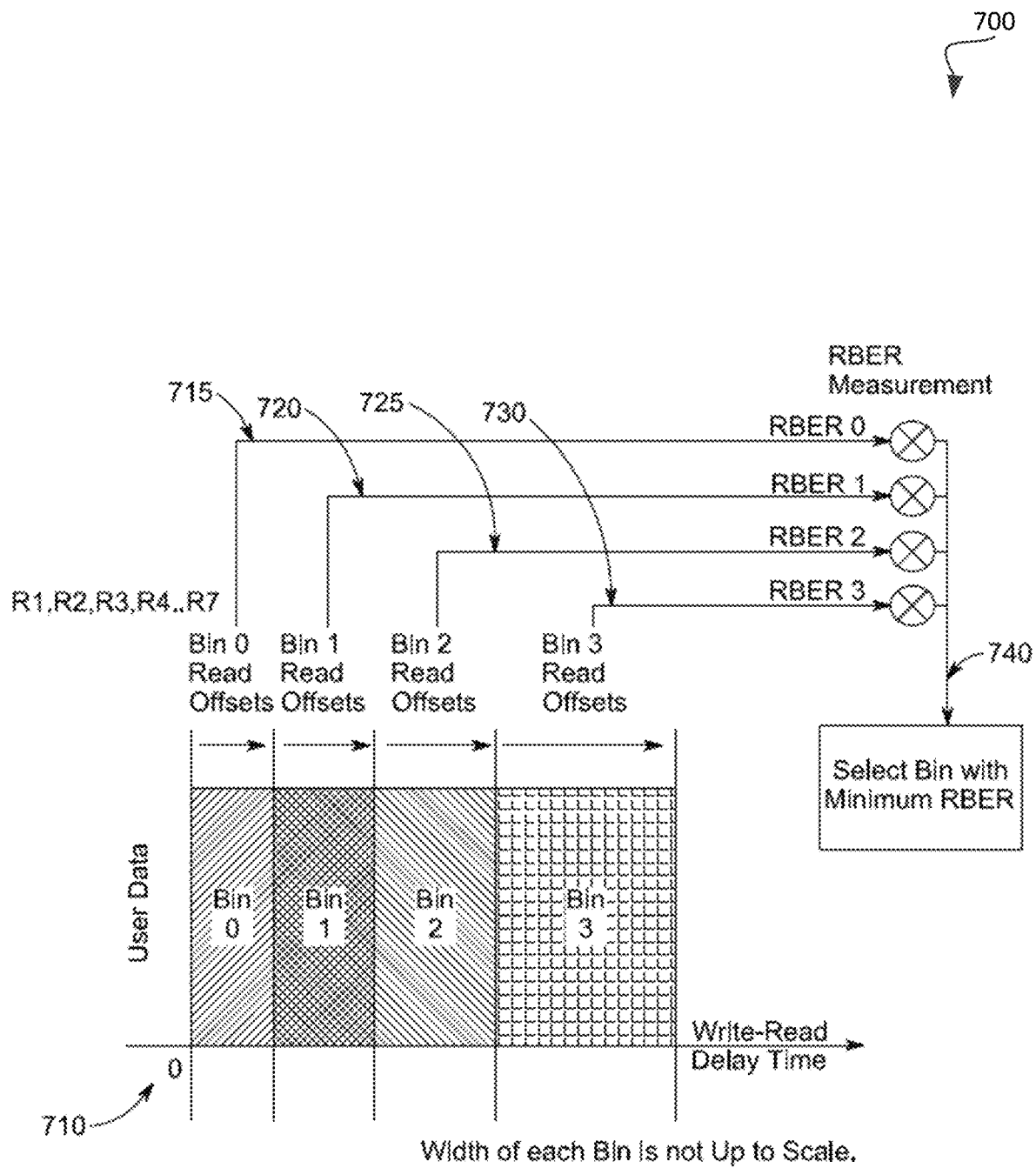
FIG. 7 illustrates an example method of assigning a block of a memory device to a voltage bin based on bit error rate measurement of a bin determination threshold voltage offset of the voltage bin, in accordance with one or more aspects of the present disclosure.

FIG. 7 illustrates an example method of assigning a block of a memory device to a voltage bin based on bit error rate measurement of a bin determination threshold voltage offset of the voltage bin, in accordance with one or more aspects of the present disclosure. Method 700 may be performed by processing logic that includes hardware (e.g., circuitry, dedicated logic, programmable logic, microcode, etc.), software (e.g., instructions run on a processor to perform hardware simulation), or a combination thereof. In some embodiments, method 700 is performed by voltage bin calibration component 113 of FIG. 1. In one implementation, a block of the memory device that is associated with read level 1 can be assigned to one of voltage bins 710. The voltage bin for assigning the block can be selected based on the raw bit error rate (RBER) measurement corresponding to bin determination threshold voltage offset at read level 1 of the voltage bin, such that the voltage bin resulting in a minimum RBER is selected. The RBER can be defined as a reliability metric measuring the ratio of the number of erroneous bits to the number of all data bits stored in a data unit of the memory sub-system.

At operation 715, a processing logic executing method 700 performs a read operation of the block at read level 1 using a bin determination threshold voltage offset corresponding to read level 1 of Bin 0. Bin 0 can include a set of read levels corresponding to valleys between data states of a corresponding memory cell of the memory device. The processing logic then selects the bin determination threshold voltage offset of read level 1 of Bin 0 to perform the read operation of data stored at the block associated with read level 1. The processing logic then determines RBER 0 based on results of the read operation using the threshold voltage offset of Bin 0.

At operation 720, the processing logic performs a read operation of the block at read level 1 using a bin determination threshold voltage offset corresponding to read level 1 of Bin 1. Bin 1 can include a set of read levels corresponding to valleys between data states of a corresponding memory cell of the memory device. The processing logic then selects the bin determination threshold voltage offset of read level 1 of Bin 1 to perform the read operation of data stored at the block associated with read level 1. The processing logic can then determine RBER 1 based on results of the read operation using the threshold voltage offset of Bin 1.

Similarly, at operation 725, the processing logic performs a read operation of the block at read level 1 using a bin determination threshold voltage offset corresponding to read level 1 of Bin 2, and determines RBER 2 based on results of the read operation using the threshold voltage offset of Bin 2. At operation 730, the processing logic performs a read operation of the block at read level 1 using a bin determination threshold voltage offset corresponding to read level 1 of Bin 3, and determines RBER 3 based on results of the read operation using the threshold voltage offset of Bin 3.

At operation 740, the processing logic compares RBER 0 of Bin 0, RBER 1 of Bin 1, RBER 2 of BIN 2, and RBER 3 of Bin 3 to identify the minimum RBER. The voltage bin corresponding to the minimum RBER can then be assigned to the given block. In implementations, the block can be assigned to the voltage bin at read level 1 and the association between the read level, the block, and the voltage bin can be stored at metadata tables, as explained in more details herein with respect to FIG. 2.

Figure 8:
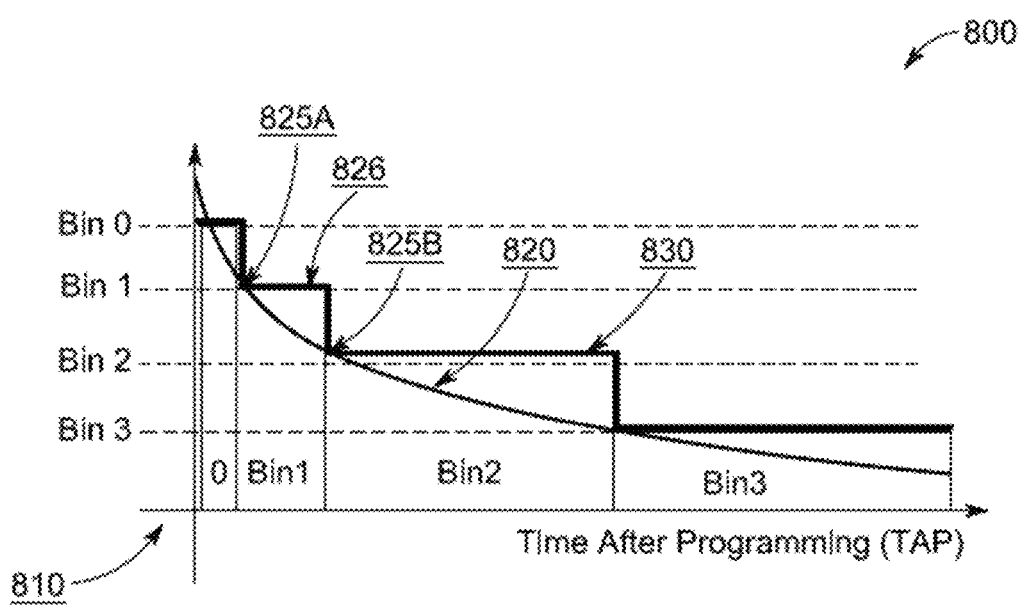
FIG. 8 illustrates an example method of supporting a read operation threshold voltage offset and a bin determination threshold voltage offset for each voltage bin of a memory device, in accordance with one or more aspects of the present disclosure.

FIG. 8 illustrates an example method of supporting a read operation threshold voltage offset and a bin determination threshold voltage offset for each voltage bin of a memory device, in accordance with one or more aspects of the present disclosure. Method 800 may be performed by processing logic that includes hardware (e.g., circuitry, dedicated logic, programmable logic, microcode, etc.), software (e.g., instructions run on a processor to perform hardware simulation), or a combination thereof. In some embodiments, the method 800 is performed by voltage bin calibration component 113 of FIG. 1. In one implementation, graph 810 schematically illustrates a set of voltage bins (bin 0 to bin 3), in accordance with embodiments of the present disclosure for a selected read level. Read operation threshold voltage offset curve 820 and bin determination threshold voltage offset curve 830 illustrate the dependency of the threshold voltage offsets, on the y-axis, on the time after program, the period of time elapsed since a block had been programmed, on the x-axis for the selected read level. In one implementation, blocks of the memory device can be assigned to voltage bins based on matching a threshold voltage offset of each block with a corresponding bin determination threshold voltage offset of a voltage bin. The threshold voltage offset of the block can be a threshold voltage offset corresponding to a minimum bit error rate of a read operation of the block. When a block is assigned to a voltage bin, subsequent read operations of data stored at the block can be performed using the read operation threshold voltage offset of the voltage bin assigned to the block.

In one implementation, a newly programmed block can be associated with bin 0. Then, the memory sub-system controller can periodically perform a foreground or background calibration process in order to associate each block of every die with one of the predefined threshold voltage bins (bins 0-3 in the illustrative example of FIG. 8), which is in turn associated with the voltage offsets to be applied for read operations. The associations of blocks with voltage bins and dies can be stored in respective metadata tables maintained by the memory sub-system controller, as explained in more details herein with respect to FIG. 2.

As schematically illustrated by FIG. 8, graph 810 can be subdivided into multiple voltage bins, such that each voltage bin corresponds to a predetermined range of read operation threshold voltage offsets and a predetermined value of bin determination threshold voltage offset, based on a corresponding range of TAP of the voltage bin. While the illustrative example of FIG. 8 defines four voltage bins, in other implementations, various other numbers of voltage bins can be employed (e.g., 10 bins). Based on a periodically performed calibration process, the memory sub-system controller associates each block of every die with a voltage bin, which defines a set of read operation threshold voltage offsets and bin determination threshold voltage offsets to be applied to the base voltage read level in order to perform read operations and/or bin determination operations of the block, as described in more detail herein above.

In an implementation, a block of the memory device can be assigned to Bin 1 based on bin determination threshold voltage offset 826, e.g., after determining that a threshold voltage offset resulting in an efficient read operation of data of the block matches bin determination threshold voltage offset 826. When the block is assigned to Bin 1, a processing logic executing method 800 can performs read operations of the block using read operation threshold voltage offset 825A.

In one implementation, as the block assigned to Bin 1 accumulates TAP, read operation threshold voltage offset of Bin 1 can continue to gradually be updated from read operation threshold voltage offset 825A to read operation threshold voltage offset 825B, in order to maintain efficient read operations of the block. Accordingly, when the block approaches a boundary between Bin 1 and Bin 2, read operations of the block can be performed using read operation threshold voltage offset 825B, whereas blocks newly assigned to Bin 1 can continue to be assigned based bin determination threshold voltage offset 826, regardless of the corresponding TAP of the new block.

Similarly, for blocks assigned to Bin 2 and Bin 3, the processing logic can utilize, for bin determination purposes, a corresponding bin determination threshold voltage offset from bin determination threshold voltage offset graph 830. For read operation purposes of the blocks assigned to Bin 2 and Bin 3, the processing logic can utilize a corresponding read operation threshold voltage offset from read operation threshold voltage offset graph 820.

Figure 9:
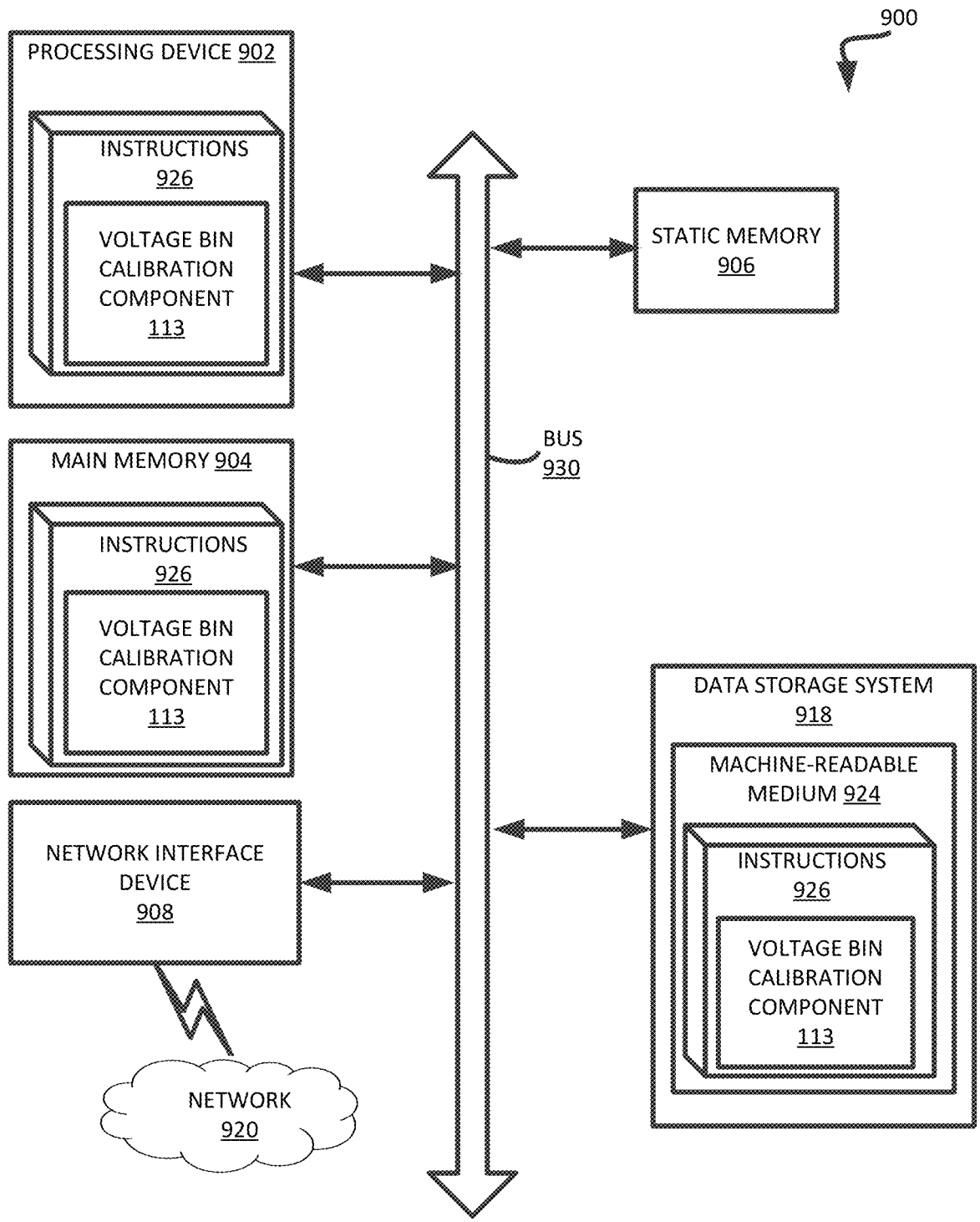
FIG. 9 illustrates an example machine of a computer system within which a set of instructions, for causing the machine to perform any one or more of the methodologies discussed herein, can be executed.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to voltage bin calibration component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to voltage bin calibration component 113 of FIG. 1. While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
receiving a first request to perform a first memory access operation of a first operation type, the first memory access operation associated with a first set of memory blocks of a memory device;
identifying, based on the first set of memory blocks, a first voltage bin of a plurality of voltage bins associated with the memory device;
performing, on the first set of memory blocks, the first memory access operation using a first threshold voltage offset associated with a read level of the first voltage bin;
receiving a second request to perform a second memory access operation of a second operation type, the second memory access operation associated with a second set of memory blocks of the memory device;
identifying, based on the second set of memory blocks, a second voltage bin of the plurality of voltage bins associated with the memory device; and performing, on the second set of memory blocks, the second memory access operation using a second threshold voltage offset associated with a read level of the second voltage bin.

2. The system of claim 1, wherein the first operation type is a read operation, wherein a plurality of read operations correspond to a plurality of page types, and wherein the first threshold voltage offset is one of a plurality of threshold voltage offsets corresponding to read levels of the page types.

3. The system of claim 1, wherein the second operation type is a bin determination operation.

4. The system of claim 1, wherein assigning the first threshold voltage offset to the read level of the first voltage bin further comprises:
identifying, among a plurality of memory blocks assigned to the first voltage bin, a subset of memory blocks having a time after program (TAP) within a predetermined threshold from a second TAP associated with a transition boundary between the first voltage bin and the second voltage bin;
determining a third threshold voltage offset associated with the subset of memory blocks; and
assigning the third threshold voltage offset to the first voltage bin.

5. The system of claim 4, wherein the processing device is to perform further operations comprising:
updating the first threshold voltage offset of the first voltage bin based on results of read operations of a plurality of memory blocks assigned to the first voltage bin; and
responsive to determining that the updated first threshold voltage offset exceeds a predetermined voltage threshold, assigning a value of the predetermined voltage threshold to the first threshold voltage offset associated with the first voltage bin.

6. The system of claim 1, wherein assigning the second threshold voltage offset to the read level of the second voltage bin further comprises:
determining, from memory blocks assigned to the second voltage bin, a subset of memory blocks having a time after program (TAP) within a predetermined threshold from a second TAP associated with a transition boundary between the second voltage bin and the first voltage bin;
determining a third threshold voltage offset associated with the subset of memory blocks; and
assigning the third threshold voltage offset to the second voltage bin.

7. The system of claim 6, wherein the first threshold voltage offset is determined during a manufacturing of the memory device, and where the second threshold voltage offset is determined during the manufacturing of the memory device, and wherein the TAP of the subset of memory blocks corresponds to a normalized time with respect to a reference temperature.

8. The system of claim 1, wherein the processing device is to perform further operations comprising:
responsive to assigning the second threshold voltage offset to the read level of the second voltage bin, assigning one or more memory blocks storing host data to the second voltage bin at the read level based on the second threshold voltage offset.

9. A method comprising:
receiving, by a processing device, a first request to perform a first memory access operation of a first operation type, the first memory access operation associated with a first set of memory blocks of a memory device;
identifying, based on the first set of memory blocks, a first voltage bin of a plurality of voltage bins associated with the memory device;
performing, on the first set of memory blocks, the first memory access operation using a first threshold voltage offset associated with a read level of the first voltage bin;
receiving a second request to perform a second memory access operation of a second operation type, the second memory access operation associated with a second set of memory blocks of the memory device;
identifying, based on the second set of memory blocks, a second voltage bin of the plurality of voltage bins associated with the memory device; and
performing, on the second set of memory blocks, the second memory access operation using a second threshold voltage offset associated with a read level of the second voltage bin.

10. The method of claim 9, wherein the first operation type is a read operation of the first set of memory blocks.

11. The method of claim 9, wherein the second operation type is a bin determination operation for the second set of memory blocks.

12. The method of claim 9 further comprising:
updating the first threshold voltage offset of the first voltage bin based on results of read operations of a set of memory blocks assigned to the first voltage bin; and
responsive to determining that the updated first threshold voltage offset exceeds a predetermined voltage threshold, assigning a value of the predetermined voltage threshold to the first threshold voltage offset associated with the first voltage bin.

13. The method of claim 9, wherein the first threshold voltage offset is determined during a manufacturing of the memory device, and where the second threshold voltage offset is determined during the manufacturing of the memory device.

14. A non-transitory computer-readable storage medium comprising instructions that, when executed by a processing device, cause the processing device to perform operations comprising:
receiving, by a processing device, a first request to perform a first memory access operation of a first operation type, the first memory access operation associated with a first set of memory blocks of a memory device;
identifying, based on the first set of memory blocks, a first voltage bin of a plurality of voltage bins associated with the memory device;
performing, on the first set of memory blocks, the first memory access operation using a first threshold voltage offset associated with a read level of the first voltage bin;
receiving a second request to perform a second memory access operation of a second operation type, the second memory access operation associated with a second set of memory blocks of the memory device;
identifying, based on the second set of memory blocks, a second voltage bin of the plurality of voltage bins associated with the memory device; and
performing, on the second set of memory blocks, the second memory access operation using a second threshold voltage offset associated with a read level of the second voltage bin.

15. The non-transitory computer-readable storage medium of claim 14, wherein the first operation type is a read operation of memory blocks associated with the read level of the first voltage bin.

16. The non-transitory computer-readable storage medium of claim 14, wherein the second operation type is a bin determination operation for memory blocks associated with the read level of the second voltage bin.

17. The non-transitory computer-readable storage medium of claim 14, wherein assigning the first threshold voltage offset to the read level of the first voltage bin further comprises:
- determining, from memory blocks assigned to the first voltage bin, a subset of memory blocks having a time after program (TAP) within a predetermined threshold from a second TAP associated with a transition boundary between the first voltage bin and the second voltage bin;
- determining a third threshold voltage offset associated with the subset of memory blocks; and
- assigning the third threshold voltage offset to the first voltage bin.

18. The non-transitory computer-readable storage medium of claim 14, wherein the processing device is to perform further operations comprising:
- updating the first threshold voltage offset of the first voltage bin based on results of read operations of a set of memory blocks assigned to the first voltage bin; and
- responsive to determining that the updated first threshold voltage offset exceeds a predetermined voltage threshold, assigning a value of the predetermined voltage threshold to the first threshold voltage offset associated with the first voltage bin.

19. The non-transitory computer-readable storage medium of claim 14, wherein assigning the second threshold voltage offset to the read level of the second voltage bin further comprises:
- determining, from memory blocks assigned to the second voltage bin, a subset of memory blocks having a time after program (TAP) within a predetermined threshold from a second TAP associated with a transition boundary between the first voltage bin and the second voltage bin;
- determining a third threshold voltage offset associated with the subset of memory blocks; and
- assigning the third threshold voltage offset to the second voltage bin.

20. The non-transitory computer-readable storage medium of claim 14, wherein the first threshold voltage offset is determined during a manufacturing of the memory device, and where the second threshold voltage offset is determined during the manufacturing of the memory device.

* * * * *